United States Patent
Shinguhara et al.

(10) Patent No.: US 9,888,585 B2
(45) Date of Patent: Feb. 6, 2018

(54) METHOD FOR MANUFACTURING WIRING STRUCTURE, COPPER DISPLACEMENT PLATING SOLUTION, AND WIRING STRUCTURE

(71) Applicants: Tokyo Electron Limited, Tokyo (JP); A School Corporation Kansai University, Suita-shi, Osaka (JP)

(72) Inventors: Shoso Shinguhara, Suita (JP); Kohei Ota, Suita (JP); Mitsuaki Iwashita, Nirasaki (JP); Nobutaka Mizutani, Nirasaki (JP)

(73) Assignees: TOKYO ELECTRON LIMITED, Tokyo (JP); A SCHOOL CORPORATION KANSAI UNIVERSITY, Osaka (JP)

( * ) Notice: Subject to any disclaimer, the term of this patent is extended or adjusted under 35 U.S.C. 154(b) by 222 days.

(21) Appl. No.: 14/865,143

(22) Filed: Sep. 25, 2015

(65) Prior Publication Data

US 2016/0095228 A1 Mar. 31, 2016

(30) Foreign Application Priority Data

Sep. 29, 2014 (JP) .................................. 2014-199299

(51) Int. Cl.
*H05K 3/00* (2006.01)
*H05K 3/42* (2006.01)
*H05K 1/03* (2006.01)
*H05K 3/24* (2006.01)

(52) U.S. Cl.
CPC ........... *H05K 3/422* (2013.01); *H05K 1/0306* (2013.01); *H05K 3/0017* (2013.01); *H05K 3/0044* (2013.01); *H05K 3/247* (2013.01); *H05K 3/421* (2013.01); *H05K 2201/035* (2013.01); *H05K 2203/025* (2013.01); *H05K 2203/073* (2013.01)

(58) Field of Classification Search
CPC .... H05K 3/442; H05K 1/0306; H05K 3/0017; H05K 3/0044; H05K 3/247; H05K 3/421; H05K 2201/035; H05K 2203/025; H05K 2203/073

See application file for complete search history.

(56) References Cited

U.S. PATENT DOCUMENTS

| | | | |
|---|---|---|---|
| 6,664,122 B1* | 12/2003 | Andryuschenko et al. | C23C 18/1617 257/E21.174 |
| 2005/0136193 A1* | 6/2005 | Weidman et al. | C23C 18/1619 427/437 |
| 2009/0197109 A1* | 8/2009 | Kawaguchi et al. | H05K 3/384 428/606 |
| 2012/0152147 A1* | 6/2012 | Norkus et al. | C23C 18/48 106/1.23 |
| 2013/0143071 A1* | 6/2013 | Kleinle | C23C 18/1637 428/658 |
| 2015/0079276 A1* | 3/2015 | Wismann | C03C 17/10 427/123 |

FOREIGN PATENT DOCUMENTS

| | | |
|---|---|---|
| JP | 2003-203914 A | 7/2003 |
| JP | 2009-019225 A | 1/2009 |
| JP | 2011-068954 A | 4/2011 |
| JP | 2012-216722 A | 11/2012 |

* cited by examiner

*Primary Examiner* — Nathan M Nutter
(74) *Attorney, Agent, or Firm* — Pearne & Gordon LLP (57) ABSTRACT

Adhesion of an underlying diffusion barrier metal film and an electroless copper plating film with respect to an insulating film can be improved. A method for manufacturing a wiring structure includes a process of forming the underlying diffusion barrier metal film 5, including a base metal with respect to copper, on the insulating film 1; and a process of forming the electroless copper plating film 6 on the underlying diffusion barrier metal film 5 by performing an electroless copper displacement plating process with a copper displacement plating solution. The copper displacement plating solution is an acidic copper displacement plating solution of pH1 to pH4, in which copper ions are contained but a reducing agent for reducing the copper ions is not contained.

4 Claims, 5 Drawing Sheets

FIG. 2

| PLATING CONDITION OF Cu DISPLACEMENT PLATING SOLUTION | |
|---|---|
| COPPER II SULFATE PENTAHYDRATE | 0.5M |
| SULFURIC ACID | 0.57M |
| pH ADJUSTER | TMAH |
| pH | 3.5 |
| PLATING TEMPERATURE(°C) | 25 (ROOM TEMPERATURE) |
| PLATING TIME(sec.) | 30 |

FIG. 3

| ADHESIVITY OF EACH PLATING FILM | |
|---|---|
| ELECTROLESS PLATING FILM | ADHESIVITY(MPa) |
| CoWB(80nm) | 20 |
| CONVENTIONAL Cu REDUCTION PLATING FILM | 2 |
| Cu DISPLACEMENT PLATING FILM | 55 |

EFFECT OF ADDITION OF EDTA
NO EDTA

FIG. 5B

EFFECT OF ADDITION OF EDTA
EDTA 0.13M

FIG. 5C

EFFECT OF ADDITION OF EDTA
EDTA 0.26M

FIG. 6

| PLATING CONDITION OF Cu DISPLACEMENT PLATING SOLUTION | | |
|---|---|---|
| SOLUTION COMPOSITION AND CONDITIONS | NO PEG | ADDITION OF PEG |
| COPPER II SULFATE PENTAHYDRATE | 0.5M | 0.5M |
| SULFURIC ACID | 0.57M | 0.57M |
| 4000 MOLECULAR WEIGHTS OF PEG | — | 500ppm |
| pH ADJUSTER | TMAH | TMAH |
| pH | 3.5 | 3.5 |
| PLATING TEMPERATURE(°C) | 25 (ROOM TEMPERATURE) | 25 (ROOM TEMPERATURE) |
| PLATING TIME(sec.) | 30 | 30 |

FIG. 7A

EFFECT OF ADDITION OF PEG
NO PEG

CROSS SECTION

SURFACE

FIG. 7B

EFFECT OF ADDITION OF PEG
ADDITION OF PEG (500ppm)

CROSS SECTION

SURFACE

METHOD FOR MANUFACTURING WIRING STRUCTURE, COPPER DISPLACEMENT PLATING SOLUTION, AND WIRING STRUCTURE

CROSS-REFERENCE TO RELATED APPLICATION

This application claims the benefit of Japanese Patent Application No. 2014-199299 filed on Sep. 29, 2014, the disclosures of which are incorporated herein by reference.

TECHNICAL FIELD

The embodiments described herein pertain generally to a method for manufacturing a wiring structure, a copper displacement plating solution, and a wiring structure.

BACKGROUND

A semiconductor chip mounted on an electronic device has been required to be more highly integrated in order to respond to requirements such as saving of a mounting area, improvement in processing rate, suppression of power consumption, and multi-functionalization.

A three-dimensional semiconductor chip has been developed in order to obtain high integration (for example, Patent Document 1).

That is, in the three-dimensional semiconductor chip, multiple semiconductor chips are stacked and the stacked semiconductor chips are wiring-connected, so that the high integration of the integrated circuit is obtained. As for each semiconductor chip used in the three-dimensional semiconductor chip, both sides of a chip plate need to be electrically connected. Therefore, conventionally, there has been employed, for example, a buried wiring in which a through-hole is formed in the semiconductor chip and a conductive member is buried within the through-hole.

As a specific method for forming such the buried wiring, there has been considered, for example, a method in which a coupling agent is adsorbed onto an entire substrate including a hole, and then, an underlying processing layer of W, WN, Ta, or TaN is formed by a CVD method or a PVD method, or a coupling agent is adsorbed onto an entire substrate including a hole and then, an underlying processing layer of an alloy including Ni, Co, WNi, or WCo, or another alloy including P or B with any one of them is formed by an electroless plating method.

Then, an electroless copper plating layer is formed on underlying processing layer by performing an electroless reduction plating process (Patent Document 2).

However, if an underlying layer is formed on a substrate and then, an electroless plating layer is formed on the underlying layer by performing the electroless reduction plating process as such, the underlying layer and the electroless plating layer are likely to be peeled off from the substrate. Thus, during an electroless plating process or during a CMP (Chemical Mechanical Polishing) process as a post-treatment, the underlying layer and the electroless plating layer may be peeled off from the substrate.

Patent Document 1: Japanese Patent Laid-open Publication No. 2003-203914

Patent Document 2: Japanese Patent Laid-open Publication No. 2012-216722

SUMMARY

In view of the foregoing, exemplary embodiments provide a method for manufacturing a wiring structure, in which it is difficult for an underlying layer and an electroless plating layer to peel off from a substrate and the underlying layer and the electroless plating layer are not likely to peel off from the substrate during a CMP process as a post-treatment, a copper displacement plating solution, and a wiring structure.

In one exemplary embodiment, a method for manufacturing a wiring structure includes a process of forming an underlying diffusion barrier metal film, including a base metal with respect to copper, on an insulating film; and a process of forming an electroless copper plating film on the underlying diffusion barrier metal film by performing an electroless copper displacement plating process with a copper displacement plating solution. Here, the copper displacement plating solution is an acidic copper displacement plating solution of pH1 to pH4, in which copper ions are contained but a reducing agent for reducing the copper ions is not contained.

In another exemplary embodiment, a copper displacement plating solution for forming an electroless copper plating film on an underlying diffusion barrier metal film, including a base metal with respect to copper, by performing a copper displacement plating process is provided. Further, the copper displacement plating solution is an acidic copper displacement plating solution of pH1 to pH4, in which copper ions are contained but a reducing agent for reducing the copper ions is not contained.

In yet another exemplary embodiment, a wiring structure includes an insulating film; an underlying diffusion barrier metal film, including a base metal with respect to copper, formed on the insulating film; and an electroless copper plaiting film formed on the underlying diffusion barrier metal film by performing an electroless copper displacement plating process with a copper displacement plating solution. Moreover, the copper displacement plating solution is an acidic copper displacement plating solution of pH1 to pH4, in which copper ions are contained but a reducing agent for reducing the copper ions is not contained.

According to the exemplary embodiments, the underlying layer and the electroless copper plating layer can be suppressed from being peeled off from the insulating layer in the wiring structure. Accordingly, the underlying layer and the electroless copper plating layer cannot be peeled off from the insulating layer during the displacement plating process and during the CMP process.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

FIG. 1A to FIG. 1I are manufacturing process diagrams illustrating an example of an electroless copper plating method in accordance with an exemplary embodiment;

FIG. 5A to FIG. 5C are diagrams showing an effect of adding EDTA into the copper displacement plating solution;

DETAILED DESCRIPTION

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Exemplary Embodiment

Hereinafter, exemplary embodiments will be described with reference to FIG. 1A to FIG. 7B.

Method for Manufacturing Wiring Structure

Firstly, a method for manufacturing a wiring structure according to an exemplary embodiment will be described with reference to FIG. 1A to FIG. 1I.

The method for manufacturing the wiring structure according to the exemplary embodiment may be performed by immersing a substrate provided with a hole in an electroless copper plating solution.

FIG. 1A to FIG. 1I are manufacturing process diagrams illustrating an example where a buried wiring is formed through a silicon substrate by applying an electroless copper plating method in accordance with the exemplary embodiment.

Figure 1A:
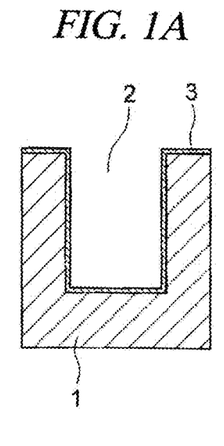
Figure 1B:
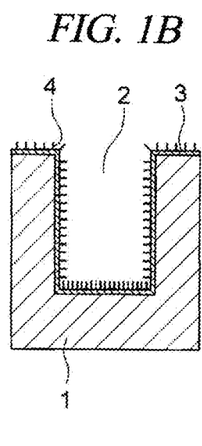
Figure 1C:
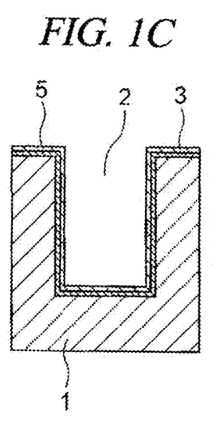
Figure 1D:
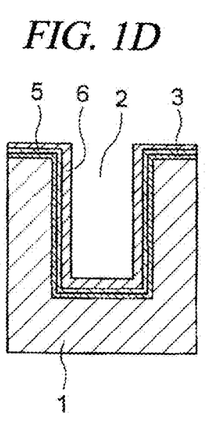
Figure 1E:
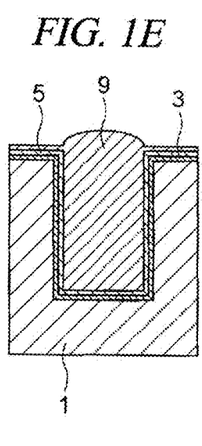
Figure 1F:
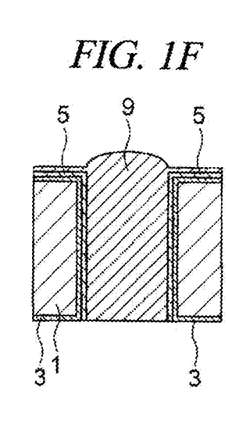
Figure 1G:
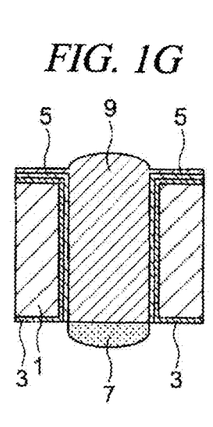
Figure 1H:
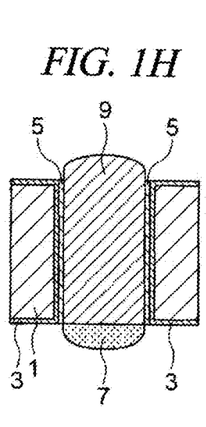
Figure 1I:
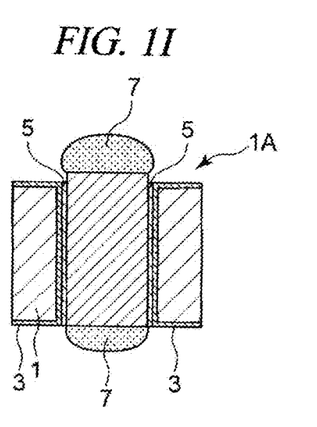

As shown in FIG. 1A to FIG. 1I, the method for manufacturing the wiring structure according to the exemplary embodiment mainly includes: a process of forming a hole 2 such a through-via hole in a silicon substrate 1 as an insulating film by a reactive ion etching process or the like (FIG. 1A); a process of forming a coupling agent layer 4 by adsorbing a coupling agent on an oxide film ($SiO_2$) 3 of the silicon substrate 1 (FIG. 1B); a process of forming an underlying diffusion barrier metal film 5 on the silicon substrate 1 provided with the hole 2 (FIG. 1C); a process of forming an electroless copper plating film 6 by immersing the silicon substrate 1, on which the underlying diffusion barrier metal film 5 is formed, in an electroless copper plating solution (FIG. 1D); a process of forming an electrolytic copper plating layer 9 by burying Cu within the hole 2 by electrolytic copper plating (FIG. 1E); a process of polishing and thinning a rear surface of the silicon substrate 1 (FIG. 1F); a process of forming a bump 7 on the hole 2 which is passed through at a rear surface side thereof (FIG. 1G); a process of removing the underlying diffusion barrier metal film 5 and the electroless copper plating film 6 on a front surface of the silicon substrate 1 (FIG. 1H); and a process of forming a bump 7 on a front surface of the hole 2 (FIG. 1I).

As the process of forming the hole 2 (via) (FIG. 1A), a conventionally known method may be appropriately employed. To be specific, for example, as a dry etching technique, a general-purpose technique using a fluorine-based or chlorine-based gas may be employed. In particular, in order to form a recess having a high aspect ratio (ratio of a depth of a hole to a diameter thereof), a method using an ICP-RIE (Inductively Coupled Plasma Reactive Ion Etching) technique capable of deep-etching at a high speed may be employed more appropriately. In particular, a so-called Bosch process in which an etching process using a sulphur hexafluoride ($SF_6$) and a protection process using a Freon-based gas such as $C_4F_8$ are repeatedly performed may be appropriately employed.

According to the exemplary embodiment, the copper plating layer can be uniformly formed at an inner side of the hole even if the hole has a small diameter and a high aspect ratio. Therefore, for example, a hole having a diameter of 1 μm to 10 μm and an aspect ratio of 5 to 10 is appropriate, and particularly, a hole having a diameter of 2 μm to 6 μm and an aspect ratio of 10 to 30 is more appropriate.

In a pre-treatment of forming the underlying diffusion barrier metal film 5, if the underlying diffusion barrier metal film 5 is formed by electroless plating, it is desirable that the coupling agent layer 4 is previously formed on a surface of the oxide film 3 formed on the silicon substrate 1 by adsorbing the coupling agent such as a silane coupling agent (FIG. 1B). As a result, it becomes easy to form the underlying diffusion barrier metal film 5.

As the process of forming the underlying diffusion barrier metal film 5 (FIG. 1C), a catalyst adsorption process may be employed. In this case, for example, a process of immersing the silicon substrate 1 in a palladium chloride solution to adsorb a Pd ion serving as a catalyst on the surface of the silicon substrate 1 may be employed. To be specific, a catalyst adsorption process is performed by immersing the silicon substrate 1 in a tin chloride solution to adsorb a tin ion on the surface of the silicon substrate 1, immersing the silicon substrate 1 in the palladium chloride solution to substitute the tin ion with the Pd ion and adsorb the Pd ion, and immersing the silicon substrate 1 in sodium hydroxide to remove the remaining tin ion and thus form a Pd colloid. Otherwise, a process of adsorbing a Pd nanoparticle on a silane coupling agent with high density may be employed.

As such, after adsorbing the Pd colloid or the Pd nanoparticle on the silicon substrate 1, the underlying diffusion barrier metal film 5 formed of Co, Ni, or an alloy thereof (for example, a Ni—W—P alloy, a Ni—W—B alloy, a Co—W—P alloy, a Co—W—B alloy, or the like) can be formed by performing an electroless plating method with an electroless plating solution on the silicon substrate 1. Otherwise, by performing a CVD method on the silicon substrate 1, the underlying diffusion barrier metal film 5 formed of Co, W, Ni, or an alloy thereof may be formed.

The process of forming the electroless copper plating film 6 (FIG. 1D) is performed by immersing the silicon substrate 1 in a copper displacement plating solution. Through this process, the electroless copper plating film 6 is formed on the substantially entire inner surface of the hole 2. In this case, the copper displacement plating solution may include an acidic copper displacement plating solution of pH1 to pH4 with copper ions. The acidic copper displacement plating solution will be described later. As described above, the underlying diffusion barrier metal film 5 includes a base metal such as Co and Ni with respect to copper contained in the copper displacement plating solution.

Then, Cu is buried within the hole 2 by electrolytic copper plating (FIG. 1E). In this process, since the electroless copper plating film 6 is previously formed in the preceding process (FIG. 1D), the electroless copper plating film 6 serves as a seed layer, so that the electrolytic copper plating layer 9 is formed.

The process of polishing and thinning the rear surface of the silicon substrate 1 (FIG. 1F) is performed until the hole 2 is passed through the rear surface to be exposed at the rear surface side (CMP process). In addition to a physical polishing method, various etching methods may be employed.

Further, in the process illustrated in FIG. 1G, the bump 7 is formed on the hole 2 which is exposed at the rear surface side. The bump 7 is formed to be protruded from the rear surface of the silicon substrate 1 and has a substantially spherical shape. Furthermore, the bump may be formed by a printing method.

Meanwhile, on the front a surface thereof, the underlying diffusion barrier metal film 5 and the electroless copper plating film 6 are removed from the hole 2 of the silicon substrate 1 by the process illustrated in FIG. 1H.

Further, by the process illustrated in FIG. 1I, the bump 7 is formed on an upper portion at the front surface of the hole 2.

Accordingly, a wiring structure 1A including the silicon substrate 1, the coupling agent layer 4, the underlying diffusion barrier metal film 5, the electroless copper plating film 6, the electrolytic copper plating layer 9, and the bump 7 is obtained.

The above-describe the method for manufacturing the wiring structure may be applied to a hole having a diameter of 1 μm to 10 μm and an aspect ratio of 5 to 10, appropriately, and particularly, a hole having a diameter of 2 μm to 6 μm and an aspect ratio of 10 to 30, more appropriately.

As such, according to the present exemplary embodiment, the electroless copper plating film 6 can be formed on the underlying diffusion barrier metal film 5 by performing an electroless copper displacement plating process with the copper displacement plating solution. If the electroless copper plating film 6 is formed by performing the electroless copper displacement plating process, an adhesivity of the underlying diffusion barrier metal film 5 and the electroless copper plating film 6 with respect to the silicon substrate 1 can be increased.

As a result, even if the CMP process is performed to the silicon substrate 1 in the post-treatment, the underlying diffusion barrier metal film 5 and the electroless copper plating film 6 may not be peeled off from the silicon substrate 1.

Forming of Electroless Plating Film

Hereinafter, the forming of the electroless plating film will be further described.

As described above, the electroless copper plating film 6 is formed by performing the electroless copper displacement plating process with the copper displacement plating solution on the underlying diffusion barrier metal film 5 formed on the silicon substrate 1. In this case, as the copper displacement plating solution, an acidic copper displacement plating solution of pH1 to pH4, in which copper ions are contained but a reducing agent for reducing the copper ions is not contained, may be used.

The copper displacement plating solution may further include a polyethylene glycol compound as a surfactant.

A molecular weight of the polyethylene glycol compound is not particularly limited, but may be desirably in the range of 1000 to 10000.

Further, a concentration of the polyethylene glycol compound is not particularly limited, but may be desirably in the range of 100 ppm to 1000 ppm.

In this case, if a molecular weight of the polyethylene glycol compound is 1000 or less, a surface roughness of the electroless copper plating film 6 is increased. Meanwhile, a molecular weight of the polyethylene glycol compound is 10000 or more, an effect of suppressing a plating is increased, so that a thickness of the electroless copper plating film 6 is decreased. Further, if a molecular weight of the polyethylene glycol compound is about 4000, the polyethylene glycol compound may effectively function as a surfactant in the range of 100 ppm to 1000 ppm.

Further, as the other components than the polyethylene glycol compound in the copper displacement plating solution, components publicly known and conventionally used for the electroless copper displacement plating process may be used. The copper displacement plating solution, in which copper ions are contained but a reducing agent for the reducing copper ions is not contained, is an acidic plating solution of pH1 to pH4 which contains a soluble copper salt as a copper ion source and a complexing (chelating) agent for copper ions and also contains a necessary additive.

The copper salt as the copper ion source is just required to generate copper ions when dissolved in water, and may include, for example, copper sulfate, copper acetate, copper chloride, copper bromide, copper oxide, copper hydroxide, and copper pyrophosphate.

The complexing agent for the copper ions is just required to form copper ions and a complex, and may include, for example, oxycarboxylic acid such as lactic acid, malic acid, tartaric acid, citric acid, and gluconic acid or salts thereof, amino-carboxylic acid such as nitrilotriacetic acid, ethylenediaminetetraacetic acid (EDTA), hydroxyethylethylenediamine triacetic acid, diethylenetriaminepenta-acetic acid, triethylenetetraminehexaacetic acid, 1,3-propanediamine tetraacetate, hydroxyethyl iminodiacetic acid, dihydroxyethyl glycine, glycolether diamine tetraacetic acid, aspartic acid diacetic acid, methylglycine diacetate, glutamic acid diacetic acid, and ethylenediamine disuccinic acid or salts thereof, triethanolamine, and glycerin.

The additive is added in order to improve the characteristics of the electroless copper plating film, improve the stability of the solution according to continuous consumption of the copper displacement plating solution, improve a plating precipitation rate, or suppress a change in a plating precipitation rate. A surfactant, a stabilizer, a pH adjuster, and the like may be appropriately added.

To be specific, the surfactant may include polypropylene glycol, polyethyleneglycol monomethyl ether, polyethyleneglycol dimethyl ether, and polyacrylic acid in addition to the above-described polyethylene glycol (PEG).

The stabilizer may include EDTA, bipyridyl (pyridyl derivative), cyanide compound, organic nitrile phenanthroline, biquinoline, and the like.

The pH adjuster may include sodium hydroxide, tetramethylammonium hydroxide (TMAH), potassium hydroxide (KOH), ammonia, and the like.

EXPERIMENTAL EXAMPLES

Experimental Example 1

Hereinafter, specific experimental examples will be described.

That is, there will be described the adhesion of the underlying diffusion barrier metal film 5 and the electroless copper plating film 6 with respect to the silicon substrate 1 when the wiring structure 1A is manufactured by the above-described method.

Firstly, the underlying diffusion barrier metal film 5 containing Co, W, and B is formed by performing the electroless plating process on the silicon substrate 1. Then, the electroless copper plating film 6 is formed on the underlying diffusion barrier metal film 5 by performing the electroless copper displacement plating process on the underlying diffusion barrier metal film 5 with a copper displacement plating solution.

Figure 2:
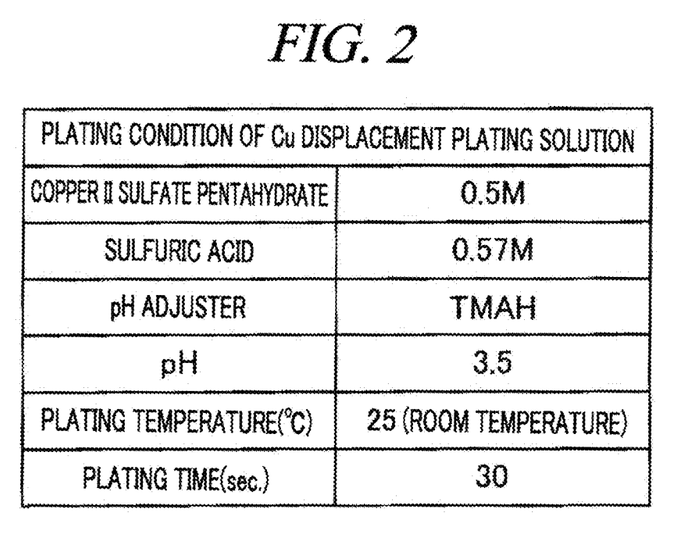
FIG. 2 is a diagram showing plating conditions for a copper displacement plating solution.

In this case, as illustrated in FIG. 2, the copper displacement plating solution includes copper II sulfate pentahydrate (0.5 M), sulfuric acid (0.57 M), and TMAH as the pH adjuster and has a pH of 3.5.

Further, a plating temperature is set to room temperature (25° C.), and a plating time is set to 30 seconds.

At this time, an adhesivity of each of plating films with respect to the silicon substrate 1 is measured.

Figure 3:
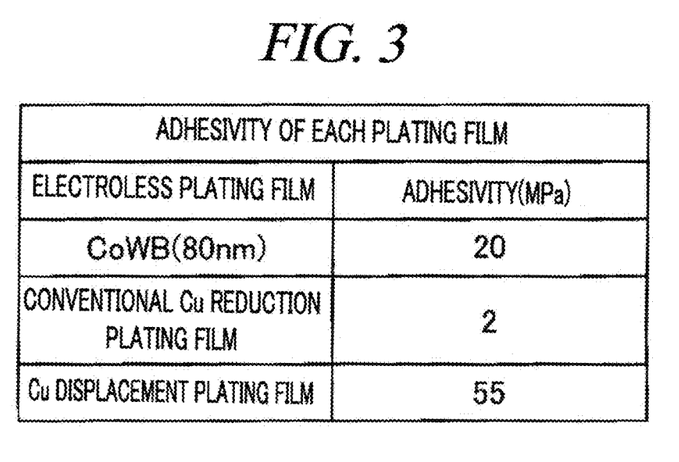
FIG. 3 is a diagram illustrating an adhesivity of each of plating films.

The measurement result thereof is as shown in FIG. 3.

As shown in FIG. 3, the adhesivity of the underlying diffusion barrier metal film 5 itself with respect to the silicon substrate 1 is 20 MPa.

Meanwhile, according to the present exemplary embodiment, if the electroless copper plating film 6 is formed on the underlying diffusion barrier metal film 5 by performing the electroless copper displacement plating process with the copper displacement plating solution, the adhesivity of the underlying diffusion barrier metal film 5 and the electroless copper plating film 6 with respect to the silicon substrate 1 is 55 MPa.

The reason is considered as follows. By forming the electroless copper plating film 6 on the underlying diffusion barrier metal film 5 with the copper displacement plating solution, a part of the underlying diffusion barrier metal film 5 is substituted with the electroless copper plating film. Thus, an internal stress of the underlying diffusion barrier metal film 5 is decreased and a great external force is needed to peel off the underlying diffusion barrier metal film 5 and the electroless copper plating film 6. As a result, the adhesion of the underlying diffusion barrier metal film 5 and the electroless copper plating film 6 with respect to the silicon substrate 1 is improved.

Meanwhile, if an electroless copper plating film is formed on an underlying diffusion barrier metal film by performing an electroless copper reduction plating process with a conventional reduction plating solution (comparative example), the adhesivity of the underlying diffusion barrier metal film and the electroless copper plating film with respect to the silicon substrate 1 is decreased to 2 MPa.

The reason is considered as follows. If the electroless copper reduction plating process is performed on the underlying diffusion barrier metal film, the electroless copper plating film 6 is formed while maintaining a thickness of the underlying diffusion barrier metal film, and an internal stress of the underlying diffusion barrier metal film 5 is maintained. Further, since an internal stress of the electroless copper plating film is added thereto, the underlying diffusion barrier metal film and the electroless copper plating film can be peeled off even by a small external force. As a result, the adhesion of the underlying diffusion barrier metal film 5 and the electroless copper plating film 6 with respect to the silicon substrate 1 is deteriorated.

Experimental Example 2

Then, when the electroless copper displacement plating process is performed on the underlying diffusion barrier metal film 5 on the silicon substrate 1, the adhesion of the underlying diffusion barrier metal film 5 and the electroless copper plating film 6 with respect to the silicon substrate 1 is evaluated while varying the pH of the copper displacement plating solution in a range of 1.5 to 3.5.

In this case, the underlying diffusion barrier metal film 5 is a metal film containing Co, W, and B.

In the experimental example 2, the electroless copper displacement plating process is performed under the same plating conditions as the above-described experimental example 1 except that the pH of the copper displacement plating solution is specified.

Figure 4:
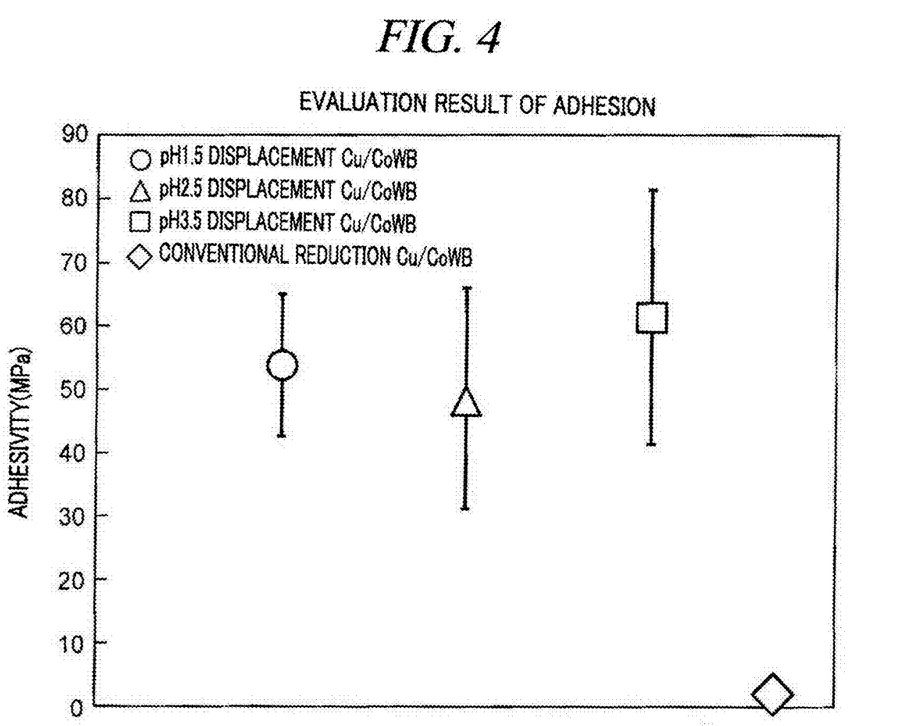
FIG. 4 is a diagram illustrating an evaluation result of adhesion.

The result thereof is as shown in FIG. 4. As shown in FIG. 4, if the pH of the copper displacement plating solution is varied in the range of 1.5 to 3.5, the adhesivity of the underlying diffusion barrier metal film 5 and the electroless copper plating film 6 with respect to the silicon substrate 1 is in the range of 35 MPa to 80 MPa in all cases.

In this regard, if the electroless copper plating film is formed on the underlying diffusion barrier metal film 5 on the silicon substrate 1 by performing the electroless copper reduction plating process with the conventional reduction plating solution (comparative example), the adhesivity of the underlying diffusion barrier metal film and the electroless copper plating film with respect to the silicon substrate 1 is about 2 MPa.

Experimental Example 3

Then, when the electroless copper displacement plating process is performed on the underlying diffusion barrier metal film 5 on the silicon substrate 1, EDTA as the pH stabilizer is added into the copper displacement plating solution. The adhesion of the underlying diffusion barrier metal film 5 and the electroless copper plating film 6 with respect to the silicon substrate 1 is evaluated while varying an amount of the added EDTA.

In this case, the underlying diffusion barrier metal film 5 is a metal film containing Co, W, and B.

In the present experimental example 3, the electroless copper displacement plating process is performed under the same plating conditions as the above-described experimental example 1 except that the amount of the added EDTA is varied.

Figure 5A:
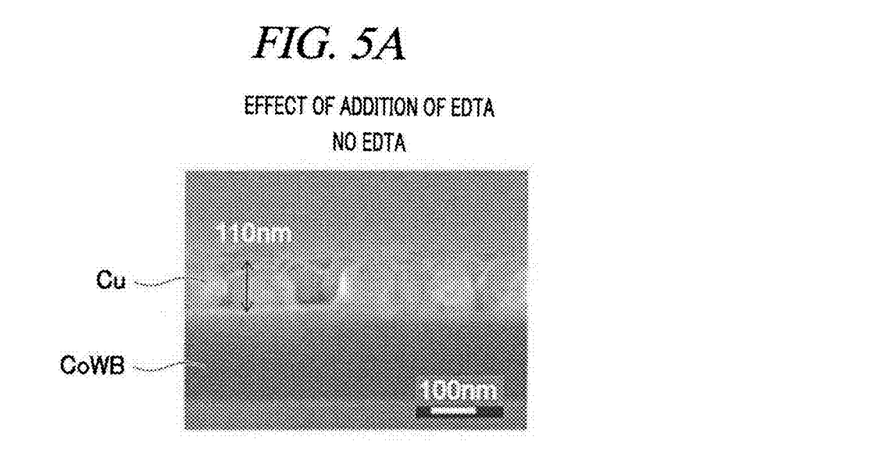
Figure 5B:
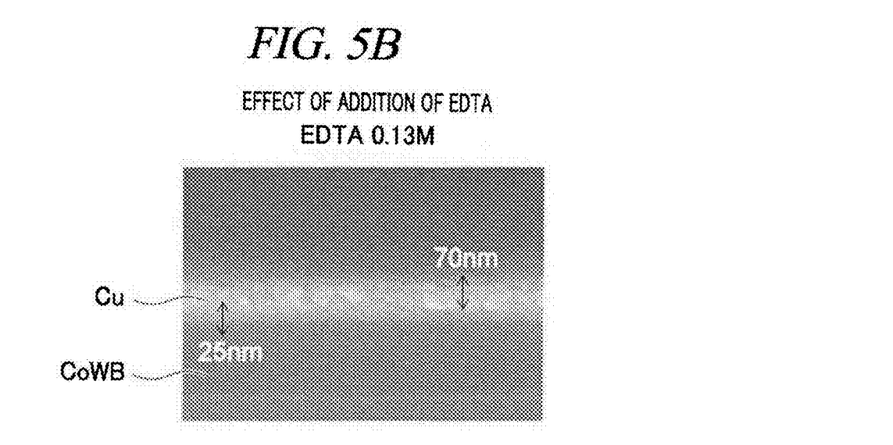
Figure 5C:
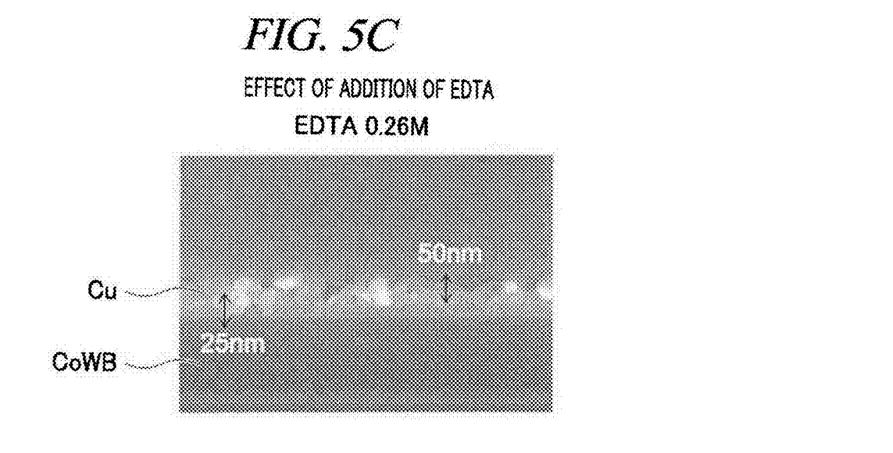

The result thereof is as shown in FIG. 5A, FIG. 5B, and FIG. 5C. If the EDTA is not added into the copper displacement plating solution, the electroless copper plating film 6 on the underlying diffusion barrier metal film 5 has a sparse structure and has a film thickness of 110 nm (FIG. 5A).

In this regard, if the EDTA is added by 0.13 M into the copper displacement plating solution, the electroless copper plating film 6 on the underlying diffusion barrier metal film 5 has a dense structure and the adhesion of the underlying diffusion barrier metal film 5 and the electroless copper plating film 6 with respect to the silicon substrate 1 is improved (FIG. 5B).

Since the EDTA is added by 0.13 M into the copper displacement plating solution, the pH of the copper displacement plating solution can be more stably maintained in an acidic range. Therefore, by stably performing the electroless copper displacement plating process, the electroless copper plating film 6 can have the a dense structure.

Further, if the EDTA is added by 0.26 M into the copper displacement plating solution, the electroless copper plating film 6 on the underlying diffusion barrier metal film 5 has a denser structure and the adhesion of the underlying diffusion barrier metal film 5 and the electroless copper plating film 6 with respect to the silicon substrate 1 is further improved (FIG. 5C).

Experimental Example 4

Then, when the electroless copper displacement plating process is performed on the underlying diffusion barrier metal film 5 on the silicon substrate 1, polyethylene glycol (PEG) as the surfactant is added into the copper displacement plating solution. In a case of adding the PEG, a structure of the underlying diffusion barrier metal film 5 and the electroless copper plating film 6 with respect to the silicon substrate 1 is evaluated.

In this case, the underlying diffusion barrier metal film 5 is a metal film containing Co, W, and B.

In the present experimental example 4, the electroless copper displacement plating process is performed under the same plating conditions as the above-described experimental example 1 except that the PEG is added.

Figure 6:
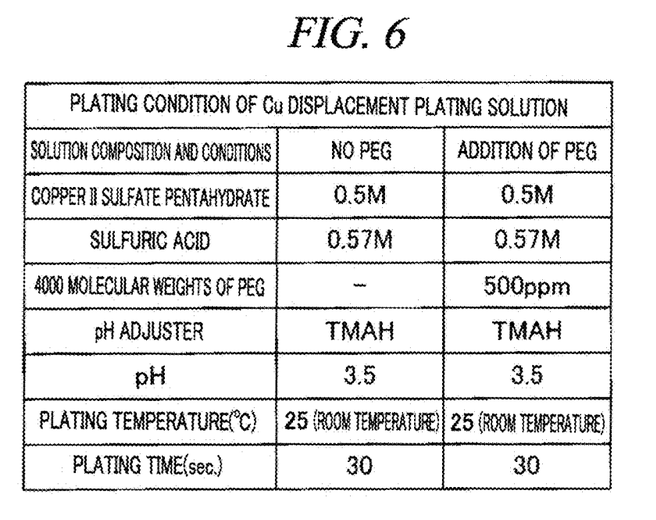
FIG. 6 is a diagram showing plating conditions of a copper displacement plating solution.

That is, the copper displacement plating solution includes copper II sulfate pentahydrate (0.5 M), sulfuric acid (0.57 M), and TMAH as the pH adjuster and has the pH of 3.5 as illustrated in FIG. 6.

Further, the plating temperature is set to room temperature (25° C.), and the plating time is set to 30 seconds.

Further, there are prepared a copper displacement plating solution in which the PEG is added and a copper displacement plating solution in which the PEG is not added, respectively.

Then, the electroless copper plating film 6 is formed by performing the electroless copper displacement plating process on the underlying diffusion barrier metal film 5 with each of the copper displacement plating solutions.

Figure 7A:
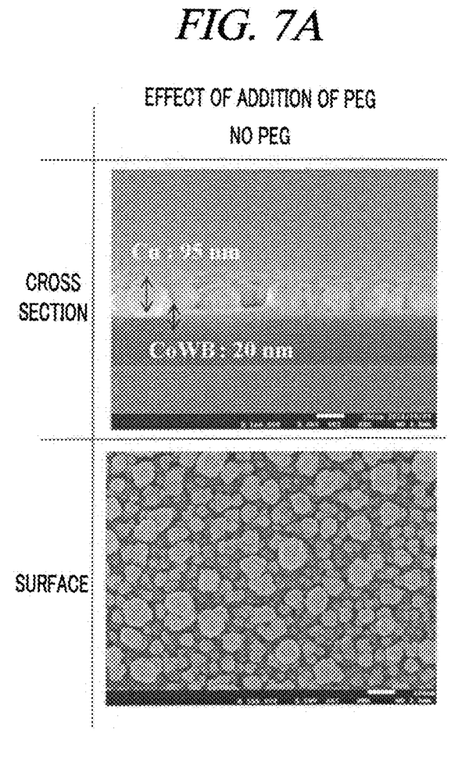
FIG. 7A and FIG. 7B are diagrams showing an effect of adding PEG into the copper displacement plating solution.

If the PEG is not added into the copper displacement plating solution, the underlying diffusion barrier metal film 5 (Co, W, B) 5 has a film thickness of 20 nm and the electroless copper plating film (Cu) 6 has a film thickness of 95 nm (FIG. 7A)

Figure 7B:
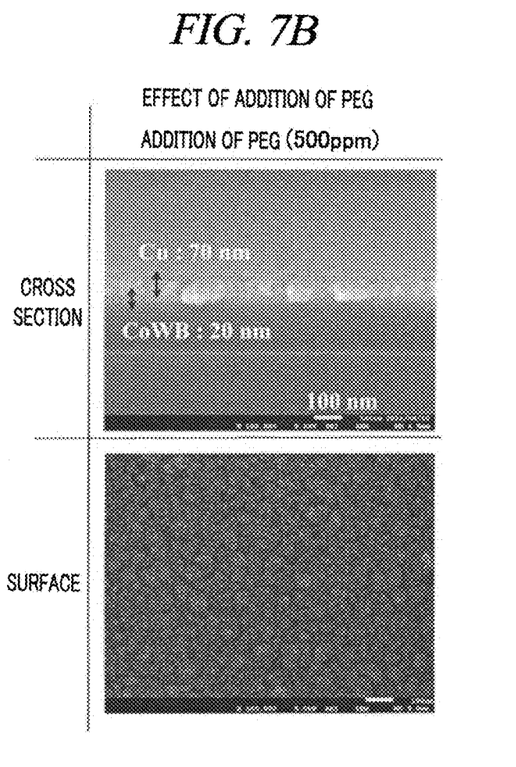

Meanwhile, if the PEG is added as the surfactant into the copper displacement plating solution, the electroless copper displacement plating process is stably performed, so that the electroless copper plating film 6 can have a dense structure. For this reason, particles of the electroless copper plating film 6 can be closely arranged, and, thus, the thickness of the electroless copper plating film 6 can be decreased to 70 nm. As a result, the adhesion of the underlying diffusion barrier metal film 5 and the electroless copper plating film 6 with respect to the silicon substrate 1 can be improved (FIG. 7B).

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

We claim:

1. A method for manufacturing a wiring structure, comprising:
    providing an object to be processed on which an insulating film is formed;
    forming an underlying diffusion barrier metal film, including a base metal with respect to copper, on the insulating film; and
    forming an electroless copper plating film on the underlying diffusion barrier metal film by performing an electroless copper displacement plating process with a copper displacement plating solution,
    wherein the copper displacement plating solution is an acidic copper displacement plating solution of pH1 to pH4, in which copper ions are contained but a reducing agent for reducing the copper ions is not contained.

2. The method for manufacturing a wiring structure of claim 1,
    wherein the copper displacement plating solution includes TMAH or KOH as a pH adjuster.

3. The method for manufacturing a wiring structure of claim 1,
    wherein the copper displacement plating solution includes EDTA as a pH stabilizer.

4. The method for manufacturing a wiring structure of claim 1,
    wherein the copper displacement plating solution includes polyethylene glycol as a surfactant.

* * * * *